United States Patent [19]

Hatano et al.

[11] 4,396,683

[45] Aug. 2, 1983

[54] PHOTOMASK BLANK PROVIDED WITH A TRANSPARENT ELECTRO-CONDUCTIVE LAYER

[75] Inventors: Takashi Hatano; Akira Maruyama; Keiko Hioka, all of Hino, Japan

[73] Assignee: Konishiroku Photo Industry Co., Ltd., Tokyo, Japan

[21] Appl. No.: 240,258

[22] Filed: Mar. 4, 1981

[30] Foreign Application Priority Data

Mar. 7, 1980 [JP] Japan .................................. 55-29459

[51] Int. Cl.³ ........................ B32B 15/04; B32B 7/02
[52] U.S. Cl. .................................... 428/469; 428/702; 428/913
[58] Field of Search ....................... 428/469, 702, 913; 427/108, 126.3; 430/5, 273, 275, 271, 276

[56] References Cited

U.S. PATENT DOCUMENTS 3,847,659 11/1974 Sobajima et al. .................... 427/108
4,251,138 2/1981 Lusis et al. ........................ 427/126.3

Primary Examiner—Paul J. Thibodeau
Attorney, Agent, or Firm—Frishauf, Holtz, Goodman & Woodward

[57] ABSTRACT

There is presented a photomask blank provided with a transparent electroconductive layer, comprising a base having (a) a transparent electroconductive material coated thereon, and also having (b) a heavy metal oxide layer laminated on said material (a) in direct contact therewith or through an intermediary light-screening layer of the same heavy metal as in said layer (b).

15 Claims, 4 Drawing Figures

PHOTOMASK BLANK PROVIDED WITH A TRANSPARENT ELECTRO-CONDUCTIVE LAYER

This invention relates to an improvement of photomask blanks which are used in manufacturing semiconductor devices and the like.

In a process for manufacturing small-sized electronic circuits such as semiconductor devices, one of the most important steps is the step of forming any desired pattern by the use of photolithography. The miniaturization of such electronic circuits mainly depends on the accuracy achieved in this step. As the electronic circuits are 7eing miniaturized with higher density, there is a change in the type of photomask, namely from the emulsion type photomask to the hard photomask. With this change, there have been proposed various pattern transfer techniques such as for ultraviolet light exposure, scale-down projection exposure, electronic beam exposure and others in addition to the conventional ultraviolet exposure process. Furthermore, the etching technique also is being changed from the prior art wet processing system to the dry processing system.

The existing photomasks having patterns of a width in the scale of sub-micron are used even in manufacturing SLSI (super large scale integrated) circuits. The photomasks are thoroughly examined before they are used to manufacture semiconductive devices and the like because the photomask has its extremely important role. In the prior art, such examinations have been carried out by the use of a pattern examining machine which comprises an automated light microscope with higher precision. If the width in lines of the pattern is of one $\mu$m or less, however, such an optical system is incapable of examining them. In order to overcome such a problem, there has been proposed a photomask checking system in which an electron beam is utilized instead of the optical system. However, the existing hard photomasks are not feasible because they are charged by an electron beam and inadequate in sensitivity for the electron beam. An electroconductive photomask has been proposed which includes a transparent and electroconductive layer coated on the photomask as a bottom layer for preventing the charge-up phenomenon, said layer being made of a material that will not be affected by an etchant of any light-screening material. This conductive photomask may be made of gold for improving the sensitivity to the electron beam, the gold being stronger against a reflected electron beam as a light-screening material. However, the gold photomask is not feasible because the gold has low physical strength.

It is an object of this invention to provide a photomask blank which can be pattern-examined by an electron beam and which is excellent in physical strength as a photomask for transferring patterns.

This invention relates to a practically useful photomask blank having improved properties with respect to the above-mentioned disadvantages of the prior art. The present invention more specifically relates to a photomask blank provided with a transparent electroconductive layer, comprising a base having (a) a transparent electroconductive material coated thereon, and also having (b) a heavy metal oxide layer laminated on said material (a) in direct contact therewith or through an intermediary light-screening layer of the same heavy metal as in said layer (b). Such a photomask blank is excellent in physical strength.

The base used in this invention may be any material which is permeable to an electromagnetic wave to be used such as X-ray or laser ray. In this respect, the transparent and electroconductive layer should also be transparent to such electromagnetic waves.

The transparent and conductive layer can be formed of a material selected from the group consisting of indium oxide, tin oxide and lead oxide by, for example, vapor deposition such as vacuum evaporation or sputtering on the base under an oxygen atmosphere.

The heavy metal in the present invention means those having a specific gravity of more than 10.0. More preferably, those metals having ±50% as much as the reflected electron beam intensity of gold, as measured by, for example, a conventional scanning type electron microscope, are useful.

Above all, tungsten, tantalum and molybdenum are most preferred.

More particularly, this invention provides a photomask blank comprising a base covered by the coating of a transparent electroconductive material, a layer of a heavy metal disposed over said coating and a further oxide layer of the same heavy metal formed over said heavy metal layer for reducing the reflectance on the surface for an exposure light and for increasing the physical strength on the surface, said heavy metal being selected from the group consisting of tungsten, tantalum, molybdenum and such other materials that have a reflected electron beam intensity similar to that of gold. Alternatively, this invention provides a photomask blank comprising a base covered by the coating of a transparent electroconductive material and an oxide layer of said heavy metal formed over said coating, said heavy metal being oxidized to such an extent as to have no adverse effect on the reflected electron beam intensity and the light-screening of exposure light. In the photomask blank of the present invention, each of the layers has a thickness generally in the range from 1 Å to 1$\mu$.

The resultant conductive photomask can effectively be used in examining patterns by the use of an electron beam under practical speed and accuracy and is extremely practicable as a photomask for pattern transfer. The heavy metals such as tungsten, tantalum and molybdenum are conventionally used in the semiconductor industry and can easily be processed by plasma etching.

This invention will now be described with respect to the embodiment thereof in connection with the accompanying drawings, in which.

Figure 1:
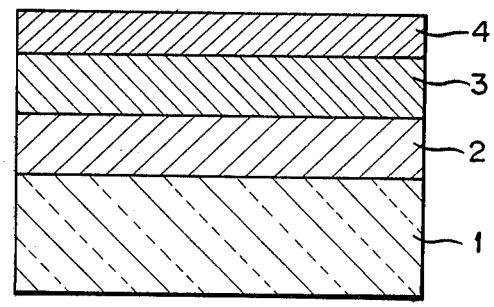
FIG. 1 is a diagrammatic cross-section showing an embodiment of the photomask blank according to this invention.

In FIG. 1, the photomask blank comprises a base plate 1 of synthetic quartz, a layer 2 of a transparent electroconductive material, a light screening layer 3 of heavy metal such as tungsten or the like and an oxide layer 4 of the same heavy metal.

Figure 2:
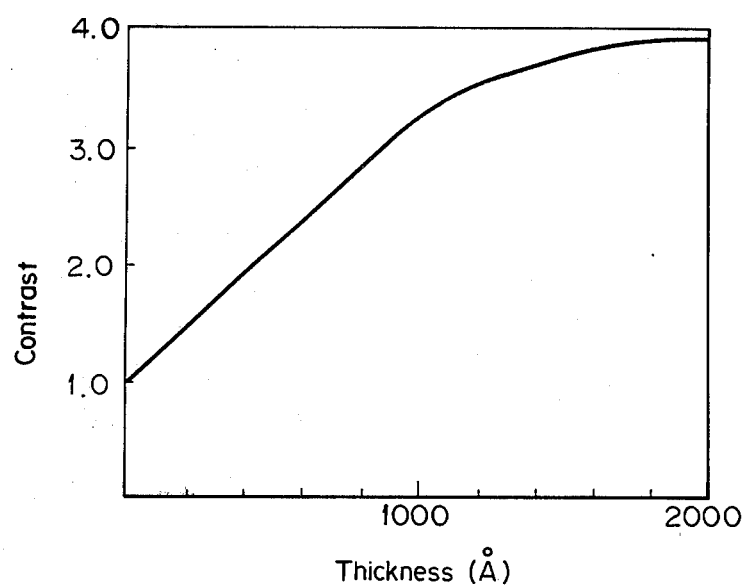
FIG. 2 is the graph showing the relation between the thickness of a tungsten layer and the contrast of a reflected electron beam.

FIG. 2 shows the relationship between the thickness of a tungsten layer and the contrast of a reflected electron beam. This contrast can be obtained by the use of the following formula.

Contrast = Intensity of electron reflected at the heavy metal layer/Intensity of electron reflected at the transparent electroconductive layer.

Figure 3:
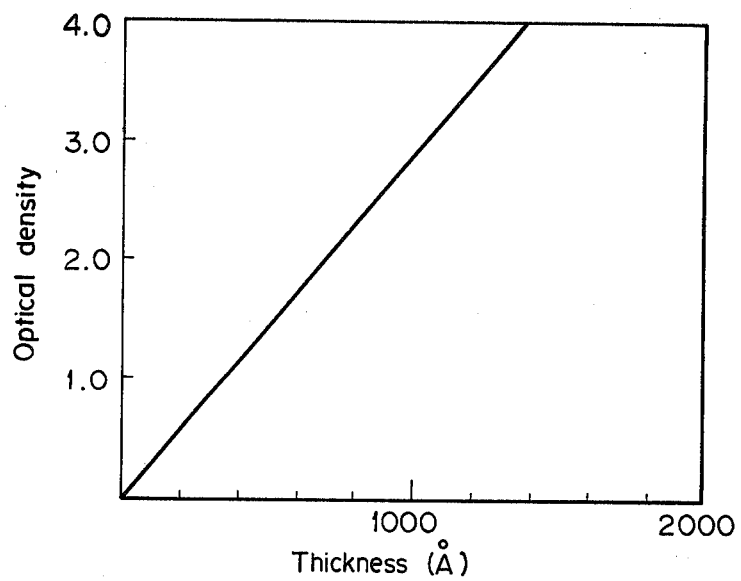
FIG. 3 is a graph showing the relationship between the thickness of the tungsten layer and the optical density.

FIG. 3 shows the relationship between the thickness of a tungsten layer and the optical density when a wavelength of the light used is 436 nm. It is understood from FIGS. 2 and 3 that the contrast in the electron beam and also the light-screening property (optical density) during exposure are sufficient in practice if the thickness of the tungsten layer is on the order of 1000 Å.

Figure 4:
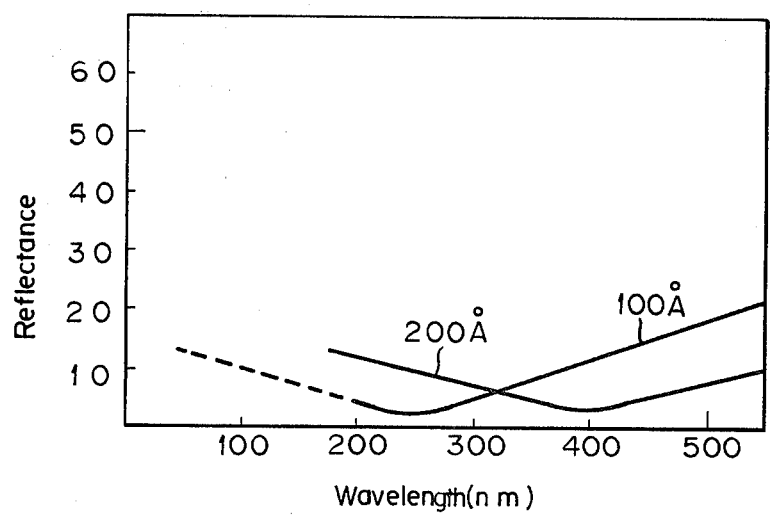
FIG. 4 is a graph showing the spectral reflectance on the surface in the photomask blank of this invention.

FIG. 4 illustrates the spectral reflectance at surface when the tungsten oxide layer at the top is 100 Å or 200 Å in thickness.

The photomask blanks according to this invention can be easily patterned by using plasma etching of gaseous carbon tetrafluoride after a resist image has been formed by the conventional photolithography or electron-beam lithography.

By using the photomask blank of this invention, electron-beam examination for lines in a pattern can be effectively carried out with higher accuracy and yet a practical photomask having less reflection at the pattern can be obtained. Therefore, this invention is extremely useful in manufacturing semiconductor circuits which require higher density in the patterns, particularly, SLSI circuits.

EXAMPLE

An indium oxide layer was formed on a base plate of synthetic quartz which was placed within a sputtering device. Thereafter, on the composite of the base plate and indium oxide layer, there was laminated a tungsten layer by the heat treatment of tungsten in an atmosphere of argon under a pressure of $5 \times 10^{-3}$ Torr. Subsequently, the composite was further subjected to the heat treatment in an atmosphere of $3 \times 10^{-3}$ Torr. argon and $1 \times 10^{-3}$ Torr. oxygen to form a tungsten oxide layer over the surface of the tungsten layer. The thickness of these heavy metal layers was each 1000 Å. The resultant photomask is hereinafter referred to as Sample No. 1.

On the other hand, an indium oxide layer was formed on a transparent base plate of glass which was placed within the sputtering device. Thereafter, a gold layer was vapor deposited over the transparent electroconductive layer in vacuo of $2 \times 10^{-5}$ Torr. This assembly is hereinafter referred to as Comparative sample.

These samples were measured with respect to layer strength by the use of a scratch tester. Some other characteristics also were tested. The results are indicated in the following Table.

|  | Sample No. 1 | Comparative sample |
| --- | --- | --- |
| Contrast of reflected electron | 3.5 | 3.3 |
| Film strength | >500 g. | 30 g. |
| Reflectance at surface (436 nm) | <5% | 35% |
| Optical transmission density | 2.8 | 1.7 |

From the results shown in the Table, it is understood that the photomask blank according to this invention is better suited for minute patterns because of its higher layer strength and lower surface reflectance, as compared with the prior art substrate having gold vapor deposited thereon.

We claim:

1. A photomask blank provided with a transparent electroconductive layer, comprising a base having (a) a transparent electroconductive material coated layer thereon, and also having (b) a heavy metal oxide layer laminated on said material (a) in direct contact therewith or through an intermediary light-screening layer of a heavy metal which is the same heavy metal as that comprised in said heavy metal oxide in said layer (b); each of said layers having a thickness of between 1 Å and 1μ.

2. The photomask blank of claim 1, wherein said transparent electroconductive material (a) is at least one oxide selected from the group consisting of indium oxide, tin oxide and lead oxide.

3. The photomask blank of claim 1, wherein said heavy metal is one having a specific gravity of 10 or more.

4. The photomask blank of claim 3, wherein said heavy metal is one having a reflected electron beam intensity ±50% of the reflected electron beam intensity of gold.

5. The photomask blank of claim 1 or 2, wherein said heavy metal is at least one selected from the group consisting of tungsten, tantalum and molybdenum.

6. The photomask blank of claim 1 comprising a base having (a) said transparent electroconductive material coated layer thereon, an intermediate layer of a light-screening heavy metal coated on said layer (a) and (b) an oxide of said heavy metal coating said heavy metal intermediate layer.

7. The photomask blank of claim 1 having said transparent electroconductive material coated layer and a heavy metal oxide layer laminated on said transparent electroconductive material coated layer.

8. The photomask blank of claim 6 or 7, wherein said transparent electroconductive material (a) is at least one oxide selected from the group consisting of indium oxide, tin oxide and lead oxide.

9. The photomask blank of claim 6 or 7, wherein said heavy metal is one having a specific gravity of 10 or more.

10. The photomask blank of claim 9, wherein said heavy metal is one having a reflected electron beam intensity ±50% of the reflected electron beam intensity of gold.

11. The photomask blank of claim 8, wherein said heavy metal is at least one selected from the group consisting of tungsten, tantalum and molybdenum.

12. The photomask blank of claim 11, wherein said transparent electroconductive material is indium oxide.

13. The photomask blank of claim 11, wherein said transparent electroconductive material is tin oxide.

14. The photomask blank of claim 11, wherein said transparent electroconductive material is lead oxide.

15. The photomask blank of claim 11, wherein said heavy metal is tungsten.

* * * * *